US006817866B1

(12) United States Patent
Ginzburg et al.

(10) Patent No.: US 6,817,866 B1
(45) Date of Patent: Nov. 16, 2004

(54) MOBILE MRI SYSTEM AND METHOD OF PROMOTING USE OF MRI SYSTEM

(75) Inventors: Sol Ginzburg, Melville, NY (US); Raymond V. Damadian, Melville, NY (US); Ralph H. Terrell, Melville, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 09/717,382

(22) Filed: Nov. 22, 2000

Related U.S. Application Data

(60) Provisional application No. 60/167,012, filed on Nov. 23, 1999.

(51) Int. Cl.[7] .............................................. G09B 25/00
(52) U.S. Cl. ...................................................... 434/365
(58) Field of Search ................................. 434/365, 370, 434/262, 267, 107; 52/143; 296/26.01, 26.03, 26.08, 26.09

(56) References Cited

U.S. PATENT DOCUMENTS

| | | | | | |
|---|---|---|---|---|---|
| 4,746,009 A | * | 5/1988 | Liberman | ................ | 206/44.11 |
| 4,891,712 A | * | 1/1990 | Spitzer | ........................ | 358/335 |
| 4,958,874 A | * | 9/1990 | Hegedus | ...................... | 296/26 |
| 5,170,901 A | * | 12/1992 | Bersani | ....................... | 220/1.5 |
| 5,304,930 A | * | 4/1994 | Crowley et al. | ............. | 324/309 |
| 5,310,209 A | * | 5/1994 | Holman | ....................... | 280/656 |
| 5,375,899 A | * | 12/1994 | Wright | ......................... | 296/21 |
| 5,496,175 A | * | 3/1996 | Oyama | ........................ | 434/118 |
| 5,595,414 A | * | 1/1997 | Dulnig | ........................ | 296/26 |
| 5,706,616 A | * | 1/1998 | Fernandez | ................... | 52/143 |
| 5,822,744 A | * | 10/1998 | Kesel | ........................... | 706/52 |
| 5,964,065 A | * | 10/1999 | Migurski | ....................... | 52/64 |
| 6,117,078 A | * | 9/2000 | Lysyansky | .................. | 600/437 |
| 6,209,939 B1 | * | 4/2001 | Wacker | ..................... | 296/24.1 |
| 6,311,163 B1 | * | 10/2001 | Sheehan | ........................ | 705/2 |
| 6,358,546 B1 | * | 3/2002 | Bebiak | ........................ | 426/232 |

OTHER PUBLICATIONS

"Mobile MRI units installed", MGH Hotline, Jun. 18, 1999 [retrieved online Aug. 9, 2003].*
Courtney Claire Brigham, "A New Bedside Manner" Eagle Tribune, Apr. 18, 1999 [retrieved online Aug. 9, 2003].*
1999 Kentucky MRI Procedures by Facility [retrieved online Aug. 9, 2003].*

* cited by examiner

Primary Examiner—Kurt Fernstrom
(74) Attorney, Agent, or Firm—IP Strategies

(57) ABSTRACT

A trailer or other mobile carrier may be utilized as a promotional system for promoting sales and education of nuclear magnetic resonance (NMR) imaging devices and systems. The trailer may house a set-up that includes an MRI scanner that may be operational or may be a mock-up system designed to simulate the operation of an actual MRI scanner. The trailer may also house monitoring equipment for presenting real or simulated NMRI imaging information. Other equipment, either operational or designed for demonstration purposes only, that is necessary to or that facilitates an NMRI diagnostic procedure may also be included in the trailer. The equipment may be housed inside the trailer so that observers may easily view the equipment therein from any desired perspective. Further, the equipment may be arranged so that an observer may put himself in the place of a patient undergoing an NMRI diagnostic procedure, so that a first-hand hand evaluation of the equipment may be made.

41 Claims, 4 Drawing Sheets

MOBILE MRI SYSTEM AND METHOD OF PROMOTING USE OF MRI SYSTEM

A right of priority is hereby claimed pursuant to 35 USC §119 of U.S. Provisional Patent Application Ser. No. 60/167,012, which was filed on Nov. 23, 1999.

FIELD OF THE INVENTION

In general, the present invention relates to an operational MRI system that may be moved easily to different locations. The present invention also relates to promoting the use and sale of an MRI system by showcasing the system and its method of operation, in a mobile set-up. In particular, the present invention is an operational or mock-up MRI system that may be mounted inside of a trailer that may be transported by a truck. The inside of the trailer may be outfitted to facilitate demonstration of the process of performing an MRI scan. Through the demonstration of the operation of the system, sales opportunities may be enhanced.

BACKGROUND OF THE INVENTION

Magnetic resonance imaging (MRI) is one of the most versatile and fastest growing modalities in medical imaging. Since the discovery by Dr. Raymond Damadian in the early 1970s that nuclear magnetic resonance techniques may be used to scan the human body to yield useful diagnostic information, medical NMR imaging devices have been developed for obtaining NMR images of the internal structures of patients. Subsequently, much effort has been expended to improve and refine the techniques used for obtaining NMR images, as well as to determine the diagnostic utility of NMR images. As a result, NMR imaging, or magnetic resonance imaging (MRI), as it is sometimes known, has today proven to be an extremely useful tool in the medical community for the purposes of detecting and diagnosing abnormalities within a patient's body.

Such MRI systems may be large and expensive. Generally, use of these systems is complicated, and may be uncomfortable for the patient undergoing the procedure. Different models of systems a manufactured by a manufacturer, and models sold by competing manufacturers, vary in many respects. Different models have widely varying technical capabilities from the viewpoint of diagnostic utility, and vary as to the comfort level afforded to the subject patient. Personnel making purchasing decisions for a health care facility, usually hospital administrators, may be typically presented with marketing material in the form of written information describing MRI systems. Given such information, certain comparisons may readily be made to help determine which system should be purchased, but other intangible, important factors simply cannot be evaluated in a meaningful way based on a written description. These intangible factors include ease of use of the system, and patient comfort, among other considerations.

Besides the basic ergonomic considerations for taking these intangible factors into account, they also have a real effect on patient throughput, and, therefore, the hospital's financial bottom line. For example, the more uncomfortable an image scan is for a patient, the longer that patient will require to rest between scans, slowing the overall procedure. Discomfort for the patient may also lead to patient movement, which may cause a corrupted or incomplete scan that further increases the scan time or even requires a re-scan. Further, if the system is complicated to operate, a longer amount of time may be necessary when conducting a scan for operator setup, loading information into the apparatus with respect to the conditions and sequencing for collection of data, etc. Therefore, the total scanning time may be quite long. It is apparent that one of the major problems with medical NMR imaging is patient throughput. Numerous efforts have been devoted to the development of techniques for obtaining images in a shorter period of time, but the results of these efforts may not be really apparent from a written description of the system, and must be experienced or observed in person to be appreciated.

MRI systems have improved in recent years. Scans are faster in general, and scan times have improved tremendously for particular models. The scan space may also be more open, and therefore more comfortable for the patient undergoing the scan. However, many patients still regard an MRI procedure as a long, claustrophobic experience. Most patients, and many doctors and health care facility administrators may be unaware of the progress made in ensuring that an MRI diagnosis is a more comfortable experience than it was years ago. As a result, patients who could benefit from an MRI diagnosis may opt not to have one, leading to possible mis-diagnosis of injury, undue pain and discomfort, and wasted money on the part of the patient and insurance companies. Such waste of money is a major area of concern for health care providers, insurance companies, as well as local and national legislators.

Further, doctors who may be unaware of the advances made in MRI technology may not prescribe an MRI scan to a patient who could benefit from such a procedure. For example, the doctor may incorrectly believe that the discomfort associated with the scan would be greater than that of the injury itself, which will then go untreated or otherwise mistreated due to the doctor's mistaken impression. Further, the doctor may have the erroneous impression that MRI scans do not provide images having a fine enough resolution to diagnose a particular problem and may seek other, less accurate and more expensive means of diagnosing a patient's problem.

Therefore, there is a great need on the part of hospital administrators to learn about advances in MRI technology, and to learn about the latest models of systems and what may be offered so that they may be able to make a more informed decision when ordering an MRI system for the hospital.

There is also a great need for doctors and patients to learn about advances in MRI technology. This would help doctors to more effectively utilize the technology at their disposal to better and more economically treat their patients. This would also help patients realize and understand the options that may be available to them in seeking treatment, both as to the capability of MRI scanning and as to which models of MRI scanning systems may be better so that the appropriate facility may be chosen. In extreme cases, a demonstration would enable some patients to overcome the fear associated with undergoing MRI diagnosis.

Further, there is a need for MRI system manufacturers and marketers to educate hospital administrators in advances in MRI technology, as well, by demonstrating the capabilities of particular models of MRI systems, in order to increase sales of MRI machines. It is also in the interest of MRI system manufacturers and marketers to educate doctors in advances in MRI technology and in demonstrating the capabilities of particular models of MRI systems, in order to encourage the recommendations of doctors to hospital administrators to purchase their model of MRI system. It is also in the interest of MRI system manufacturers and marketers to educate patients in advances in MRI technology and in demonstrating the capabilities of particular models of MRI systems in order to alleviate their fears and concerns regarding undergoing an MRI diagnostic procedure, thereby encouraging future use and potentially sales of MRI systems.

However, because MRI machines are typically large and expensive, it is not practical, conventionally, to demonstrate the use of a particular model when attempting to make a sale to a hospital or other health care facility.

SUMMARY OF THE INVENTION

It is therefore an objective of the present invention to provide an MRI system that is easily demonstrated to hospital administrators, doctors, and patients, and to health care facility personnel in general.

It is a further objective of the present invention to provide an MRI system that may be demonstrated to hospital administrators, doctors, and patients at their convenience.

It is also an objective of the present invention to provide an MRI system for demonstration that is operable, so that potential purchasers and users of the system may more realistically assess the system's capabilities.

It is an additional objective of the present invention to provide a mock-up MRI system that realistically demonstrates an MRI diagnostic procedure, but at a much lower cost than an actual operational MRI system.

It is another objective of the present invention to provide an MRI system demonstration set-up that may be used as a marketing tool for the sale of such MRI systems.

The apparatus of the present invention may be a trailer or other mobile carrier that includes an MRI system set-up. The set-up includes an MRI scanner that may be operational or may be a mock-up system design to simulate the operation of an actual MRI scanner. The system also includes monitoring equipment for presenting real or simulated MRI imaging information. Other equipment, either real or designed for demonstration purposes only, that is necessary to or that facilitates an MRI diagnostic procedure may also be included. Preferably, the equipment may be sheltered inside of the trailer, and may be set up such that observers may easily view the scanner and other equipment from all advantageous angles. Further, the equipment may be arranged so that an observer may put himself in the place of a patient undergoing an MRI diagnostic procedure, so that a first-hand evaluation of the equipment may be made.

This setup may be used to demonstrate operation of the system. The terms "demonstrate" and "presentation", as used herein in any form, refer to the operation of either a mock-up system or an actual operational system, for the benefit of observers. These observers include the previously-mentioned patients and health care facility personnel. While one purpose of such demonstration may be to promote education in the field of MRI, another aspect of the invention may be to use such demonstration for marketing purposes.

BRIEF DESCRIPTION OF THE DRAWINGS

The foregoing objectives and a better understanding of the present invention will become apparent from the following detailed description of example-embodiments and the claims when read in connection with the accompanying drawings, all forming a part of the disclosure of this invention. While the foregoing and following written disclosure focuses on disclosing example embodiments of this invention, it should be clearly understood that the same is by way of illustration and example only and the invention is not limited thereto. The spirit and scope of the present invention are limited only by the terms of the appended claims.

The following represents brief descriptions of the drawings, wherein.

DETAILED DESCRIPTION OF THE INVENTION

The present invention is a mobile MRI system. The invention includes an MRI scanner and other operational equipment used to make an MRI medical diagnosis. Some or all of the MRI scanning equipment in accordance with the present invention may be mockups to be used for demonstration purposes only, rather than real operational equipment. Any equipment that is a mock-up may be specially designed to simulate actual operational conditions and results. The invention also includes a trailer or other transport carrier, suitable for being pulled by a truck or other vehicle. The MRI scanner may be mounted on the trailer, which preferably provides shelter for the equipment as well.

Figure 1:
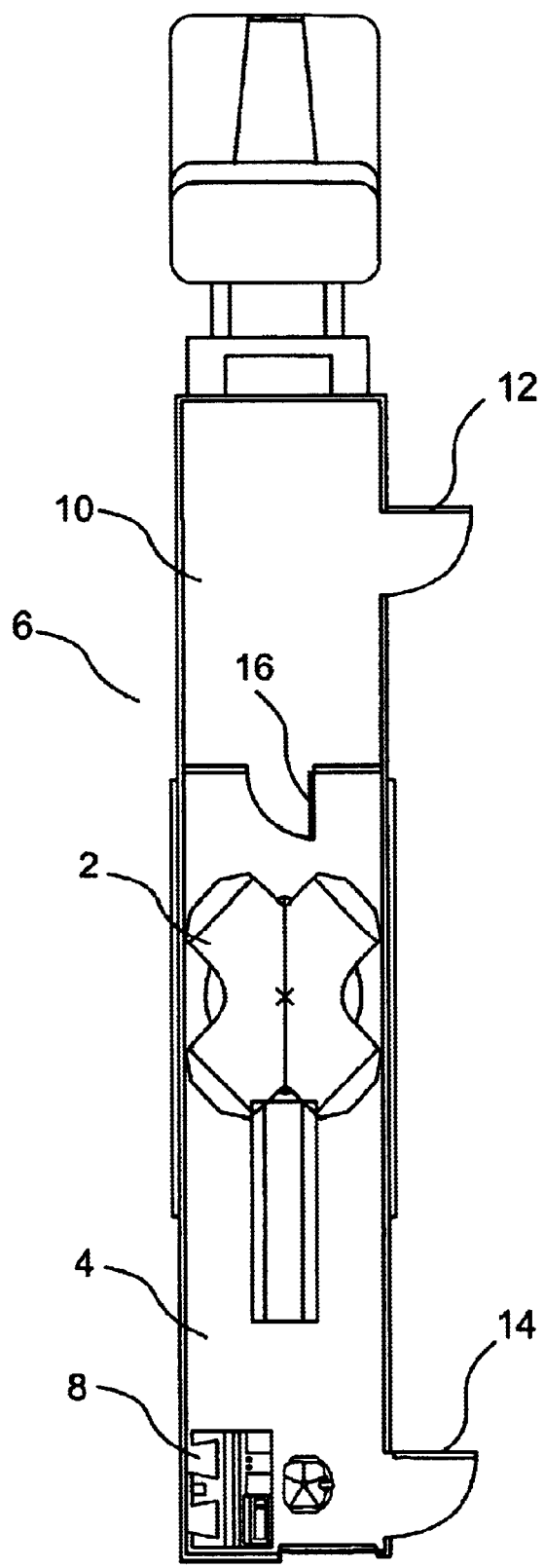
FIG. 1 shows a plan view of the mobile MRI system of the present invention, ready for transport.
Figure 2:
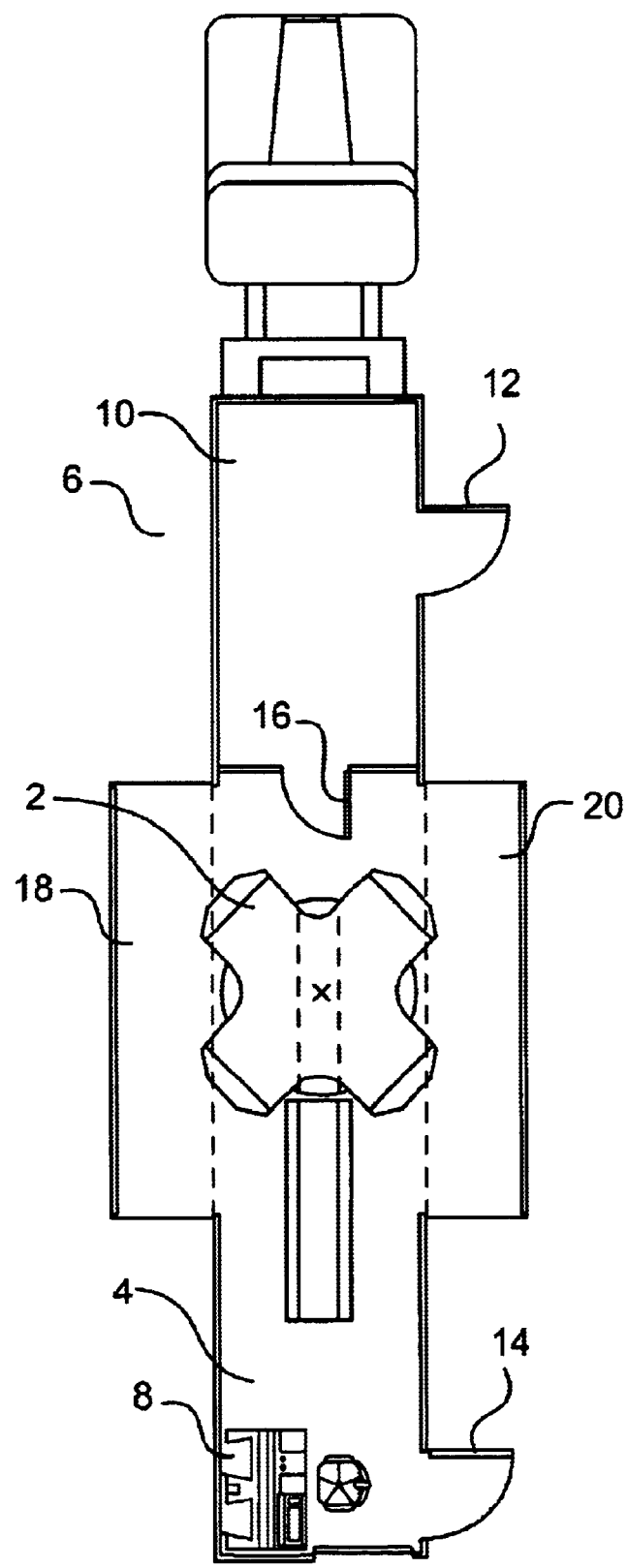
FIG. 2 shows a plan view of the mobile MRI system of the present invention, ready for demonstration.

Referring to FIG. 2, the MRI scanner 2 may be mounted in a rear portion 4 of the trailer 6. Other diagnostic equipment 8 used to collect scan data and present useful information derived from the data, may be located in another area of the rear portion 4 of the trailer 6. Cabling harnesses and conduits may be provided in the trailer so as to connect the scanner 2 with the equipment 8. It is also contemplated that an infrared system or other wireless link may be used to electrically couple the components. Of course, if the system is not operational, and is merely a mock-up, the scanner 2 and the equipment 8 need not be coupled at all. The front portion 10 of the trailer 6 may be used for storage, or as an additional access space for entering the scanner 2. The front portion 10 of the trailer 6 may also be used as a reception or conference center for observers, and may also be used as a presentation area of the overall demonstration. This may be accomplished by providing an image display that shows the scan image or any other useful image. This front portion 10 may be fully audio-visually capable, including access hardware and ports for connection to the Internet or any other data network, as well as voice and fax hardware and interfaces.

The trailer 6 includes access doors for admitting observers to the interior of the trailer 6. The exemplary trailer 6 shown in FIG. 2 has a front access door 12 and a rear access door 14. The rear access door 14 provides access for observers to the rear portion 4 of the trailer 6, and the front access door 12 provides access to the front portion 10 of the trailer 6. An interior door 16 connects the front portion 10 with the rear portion 4.

As shown in FIG. 2, the trailer may be configured for transport of the MRI scanning equipment. The exemplary scanner 2 shown in the figure may be a mock-up that could represent any type of scanner, including a four-person scanner. Any type of mock-up or operational scanner may be contemplated for use in the system of the invention. Because the exemplary scanner 2 may be wider than a width of the trailer, it may be designed to partially collapse in one lateral direction for ease of transport.

Figure 3:
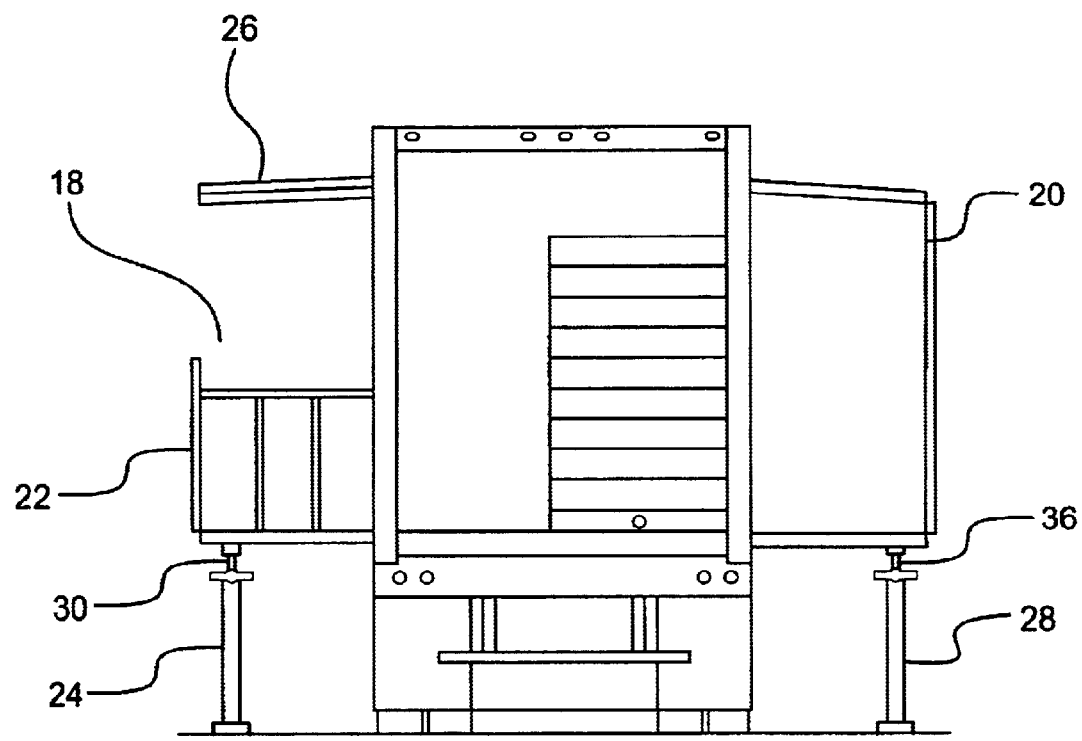
FIG. 3 shows a rear elevation view of the mobile MRI system of the present invention, ready for demonstration.

Referring to FIG. 3, the trailer 6 may be expanded in the area surrounding the scanner 2, to an open position in order to accommodate the scanner 2 in its fully operational configuration. That is, two retractable extensions 18, 20 may be provided on either side of the trailer. These extensions may be pulled out from the sides of the trailer. Once this area of the trailer has been expanded, the scanner may also be expanded, and partially moves into the additional area provided by the trailer extensions 18, 20. The configuration shown in FIG. 3 is a preferred embodiment of the invention; other expansion configurations may be contemplated within the scope of the invention. For example, the trailer may have only one extension, and the scanner could expand in one lateral direction only, moving into the additional area provided by the sole extension.

Figure 4:
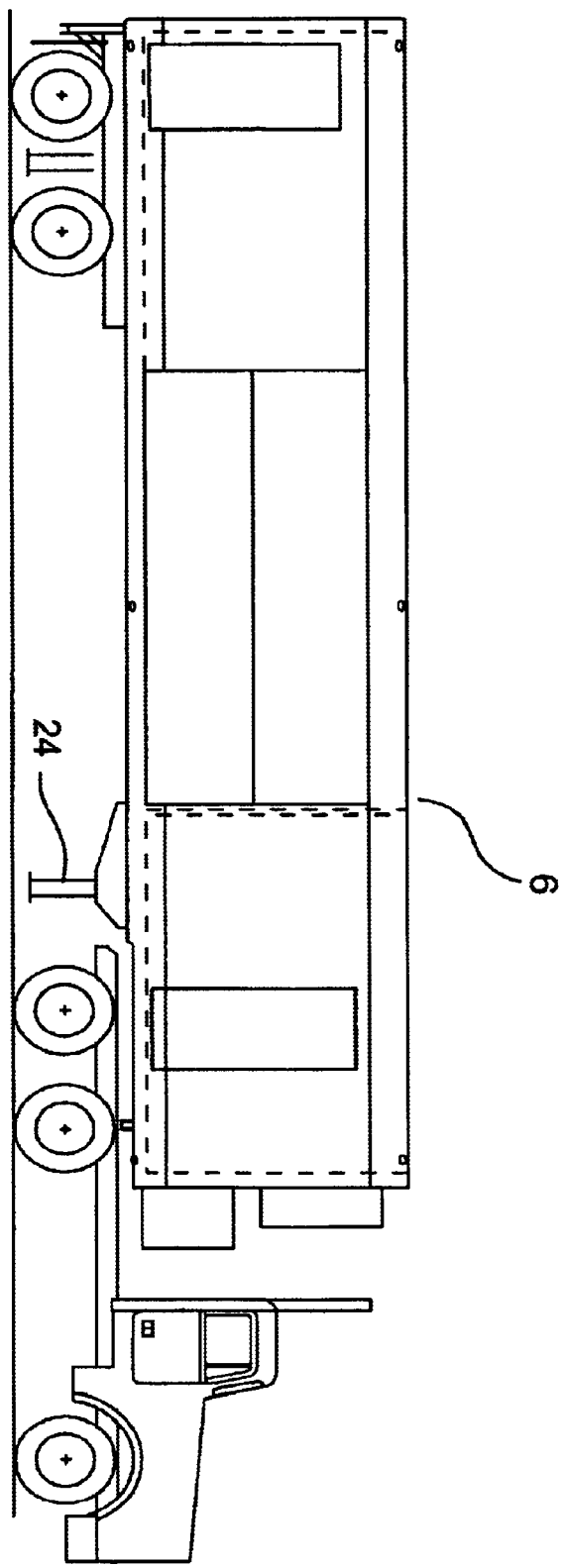
FIG. 4 shows a side elevation view of the mobile MRI system of the present invention, ready for demonstration.

Referring to FIG. 4, the two trailer expansions 18, 20 are shown in a rear elevation view of the invention. As shown, the extension 18 may be open to the outside of the trailer. In such a case, the bottom portion 22 pulls out from the side of the trailer and rests on at least one stand 24 for support. A panel 26 pulls out or swings up into place as an overhang to provide protection from the elements. Alternatively, the extension 20 may be a fully closed structure that pulls out from the side of the trailer and rests on at least one stand 28 for support.

The stands 24, 28 may remain attached to the undersides of the respective trailer extensions 18, 20 when the extensions are put back into place for transport. This is possible because the stands 24, 28 may be attached to the trailer extensions 18, 20 by adjustment mechanisms 30, 32. When the extensions 18, 20 are retracted for transport, as shown in FIG. 5, the adjustment mechanisms 30, 32 cause the stands 24, 28 to be lifted off the ground, so as not to impede travel of the trailer. When the trailer extensions 18, 20 are disposed in the extended configuration, the adjustment mechanisms 30, 32 allow the stands 24, 28 to be lowered until the bottoms of the stands 24, 28 reach the ground so that the stands 24, 28 can assist in supporting the weight of the trailer extensions 18, 20. For example, the adjustment mechanisms 30, 32 may be threaded rods that engage threaded bores in the main bodies of the stands 24, 28. Thus, turning a stand around the axis of the rod will raise or lower the stand with respect to the trailer extension, depending on the direction of the turning. Other adjustment mechanisms may be contemplated as being within the scope of the present invention. Because the stands 24, 28 may be individually adjustable, secure support for the trailer extensions may even be achieved on uneven terrain.

According to another aspect of the present invention, a method of marketing and promoting the use of an MRI system may be provided. As discussed previously, the scanner and other MRI equipment on the trailer may be operational or it may be a mock-up. In either case, the entire construction may be transported by truck or other vehicle to a hospital or other health care facility. On reaching the destination, the truck may remain attached to the trailer with a brake mechanism in place, or the truck may be detached from the trailer. Prior to demonstrating the MRI system, the trailer extensions may be changed from the transport configuration to the operational configuration. That is, any open-type trailer extensions have the bottom portion pulled out from the trailer, the top panel put into place, and the support stand or stands lowered to the ground. Likewise, any closed-type trailer extensions may be pulled from the side of the trailer and have support stand(s) put into place.

Once the trailer extensions may be put in operational configuration, the scanner may be similarly expanded to encroach on the additional space provided by the extensions. If the system is truly operational, system checks may be performed. If a mock-up is used, any visual indicators, presentations, or simulations to be used in the presentation may be tested.

Once the system is ready for demonstration, observers may be brought in. The particular presentation given will depend on the audience viewing the presentation. Health care facility administrators and doctors will be given similar demonstrations of the diagnostic capabilities of the system, as well as of the personnel requirements for operation of the system. The in-person demonstration will give the administrators a more meaningful idea of the space needed and the logistical and economical requirements of operating and maintaining the system, and of the power and cabling burden required to set up the system. An in-person demonstration such as this may be more likely to give the administrator a favorable impression of the system and of the company putting on the demonstration, giving the company an edge in competing for sales from the hospital's equipment budget. Positive feedback from doctors, which may be more likely if they are given a hands-on opportunity to operate the equipment (either alone or with a hospital or company technician), regarding the technical capabilities of the system will reinforce the favorable impressions of the administrators.

Patients who have previously undergone an MRI procedure may be asked to participate in the demonstration as observers. These observers may be subjected to a simulated MRI diagnostic procedure, so that they may compare the experience using the demonstration system with that of the system used in the past. Favorable impressions of these observers, noted by doctors and administrators also observing, may enhance the chances of making a sale of the system. The impressions of these observers in the form of comparisons to their previous experiences may be particularly meaningful when recorded in the questionnaires described below.

Persons who have never undergone an MRI procedure but who have expressed an anxiety toward undergoing such a procedure will also be asked to participate as observers. This group of people may feel less nervous about undergoing a simulated MRI procedure. Their impressions of the experience, particularly in comparison to their expectations, may be especially meaningful in a marketing context. Favorable feedback provided by them to observing doctors and administrators will increase the likelihood of a sale of the system.

In order to make the presentation even more effective, questionnaires may be handed out to observers of all types prior to and after the demonstration. Questionnaires provided to observers and potential observers well in advance of the demonstration will help the company to tailor the demonstration to emphasize features of the system that address their most important concerns. The replies to these questionnaires may also be helpful when compared to the impressions of the observers after the demonstration, in order to judge the effectiveness of the demonstration, as well as the performance of the system.

A follow-up questionnaire may also be useful in determining areas in which the system may be improved, and also in determining which improvements were under appreciated, helping to guide future designs and marketing for the system. For example, if many respondents indicate that scanning speed was the feature of the system that demonstrated the greatest advantage over competing systems, that aspect of the system may be given more prominence in sales literature and future presentations, to co maximize the benefit of that feature. Future research may also then be directed to improving scanning speed even more. On the other hand, if many respondents indicate that overall scan space size of the system compared to other systems is not, or may not be, a factor in preferring the system to competing systems, this feature may be de-emphasized in sales literature, and money dedicated to research on improvements in this area may be diverted to other areas that are featured more prominently in answers to the questionnaires.

In summary, a mobile MRI system, whether operational or a non-operational mock-up, may be a useful tool in marketing the system. The mobile aspect of the system allows for in-person demonstrations of the operation of the system to several classes of interested persons. These classes include health care facility administrators, who make purchasing decisions and evaluate systems from a practical business point of view; doctors, who may be more interested in the technical aspects and diagnostic capabilities of the system; persons who have undergone MRI procedures in the past, who may subjectively evaluate improvements made to the system and its use; and prospective patients who have expressed concerns over a potential need to undergo an MRI procedure, who may provide valuable information as to the actual experience compared to what was expected. Responses to questionnaires provided to these observers both before and after the demonstration provide valuable insight for marketing the current system and for designing improvements for future systems. Further, the demonstrative evidence provided by an in-person demonstration of the system to those responsible for making or driving purchasing decisions enhances sales potential, and gives a more positive impression of the system than if it were only described in promotional material. Thus, the method of the invention provides a marketing tool for both the present and the future.

We claim:

1. A mobile nuclear magnetic resonance imaging demonstration system, comprising:
   a wheeled ground transport vehicle having a platform;
   a fully assembled scanner device, disposed on the platform; and
   control equipment, disposed on the platform;
   wherein the scanner device simulates an operational magnetic resonance imaging scanner, under control of the control equipment; and
   wherein the wheeled ground transport vehicle is operational to transport the fully assembled scanner device and control equipment.

2. The system of claim 1, wherein the transport vehicle includes an enclosure disposed over at least a portion of the platform.

3. The system of claim 2, wherein the enclosure encloses the scanner device and the control equipment.

4. The system of claim 1, wherein the control equipment is connected to the scanner device by conductive wiring.

5. The system of claim 1, wherein the control equipment communicates with the scanner device to control the scanner device by wireless link.

6. The system of claim 5, wherein the wireless link is an infrared link.

7. The system of claim 1, wherein the control equipment simulates MRI diagnostic equipment.

8. The system of claim 1, wherein the transport vehicle further includes a presentation area, wherein operation of the scanner device can be witnessed by observers disposed in the presentation area.

9. The system of claim 8, wherein the presentation area includes a simulated MRI image display.

10. The system of claim 9, wherein the image display is connected to the control equipment, to display scan images.

11. The system of claim 10, wherein the scan images are previously-recorded scan images.

12. The system of claim 8, wherein the presentation area includes a video monitor and that presents prerecorded audiovisual presentations that are related to operation of the magnetic resonance imaging scanner.

13. The system of claim 8, further including a terminal connected for communication via a network.

14. The system of claim 2, wherein the enclosure has at least one access door, for allowing admittance to the inside of the enclosure.

15. The system of claim 1, wherein a frame of the scanner device is wider than a width of the platform.

16. The system of claim 1, wherein the scanner device is a full-scale replica of an actual operational MRI scanner.

17. The system of claim 15, wherein an extent of the frame of the scanner device that is wider than the width of the platform is an overhang portion that overhangs a peripheral edge of the platform.

18. The system of claim 17, wherein the transport vehicle includes an enclosure disposed over at least a portion of the platform, and the enclosure includes at least one opening to accommodate the overhang portion.

19. The system of claim 17, wherein the platform includes at least one extension that, when extended, supports the overhang portion.

20. The system of claim 19, further including a stand, disposed on the ground below the extension, which supports the weight of the extension.

21. The system of claim 20, wherein the stand is adjustable in height.

22. The system of claim 21, wherein the stand is a rod having a threaded end attached to the extension.

23. The system of claim 18, further including an overhang panel that extends from the enclosure to at least partially project over the overhang portion.

24. The system of claim 18, wherein the enclosure includes an enclosure bay that retractably extends to at least partially enclose the overhang portion.

25. The system of claim 24, further including a stand, disposed on the ground below the enclosure bay, which supports the weight of the enclosure bay.

26. The system of claim 25, wherein the stand is adjustable in height.

27. The system of claim 26, wherein the stand is a rod having a threaded end attached to the enclosure bay.

28. A method of demonstrating operation of a nuclear magnetic resonance imaging system, comprising:
   disposing a fully assembled scanner device and control equipment on a platform;
   connecting the platform to a wheeled ground transport vehicle;
   transporting the platform with the fully assembled scanner device and the control equipment to a location of interest; and
   causing the scanner device to simulate an operational magnetic resonance imaging scanner, under control of the control equipment, at the location of interest.

29. The method of claim 28, wherein the location of interest is a medical facility.

30. The method of claim 28, wherein the platform includes a presentation area.

31. The method of claim 30, further comprising admitting viewers into the presentation area.

32. The method of claim 31, wherein the viewers are any of hospital administrators, medical technicians, physicians, and potential patients.

33. The method of claim 31, further comprising providing a live presentation of an MRI scanning sequence to the viewers.

34. The method of claim 33, wherein the live demonstration is a true representation of an operation of the operational magnetic resonance imaging scanner.

35. The method of claim 33, further comprising providing a pre-recorded representation of a scanning sequence to the viewers.

36. The method of claim 28, wherein the control equipment simulates magnetic resonance imaging scanner diagnostic equipment.

37. The method of claim 30, further comprising disposing within the presentation area, printed material including technical and operational information about the operational magnetic resonance imaging scanner.

38. The method of claim 30, further comprising disposing within the presentation area, printed material including at least one of marketing brochures and sales brochures directed to the operational magnetic resonance imaging scanner.

39. The method of claim 33, further comprising:

distributing questionnaires to the viewers after providing the live presentation;

asking the viewers to respond to questions on the questionnaire;

retrieving questionnaire responses;

analyzing the responses; and determining whether changes should be made to any of the simulated scanner, the operational magnetic resonance imaging scanner, and scanner marketing material, based on the analysis.

40. The method of claim 29, wherein the viewers are medical technicians, further comprising allowing at least one of the medical technicians to operate the control equipment.

41. The method of claim 29, wherein the viewers are potential patients, further comprising allowing at least one of the potential patients to enter a scan of the scanner device.

* * * * *